United States Patent
Saitoh

[11] Patent Number: 6,060,373
[45] Date of Patent: May 9, 2000

[54] METHOD FOR MANUFACTURING A FLIP CHIP SEMICONDUCTOR DEVICE

[75] Inventor: Masaru Saitoh, Tanashi, Japan

[73] Assignee: Citizen Watch Co., Ltd., Tokyo, Japan

[21] Appl. No.: 09/350,287

[22] Filed: Jul. 9, 1999

[30] Foreign Application Priority Data

Jul. 10, 1998 [JP] Japan .................................. 10-195171

[51] Int. Cl.[7] .............................. H01L 21/30; H01L 21/46
[52] U.S. Cl. ........................ 438/459; 438/612; 438/977; 148/DIG. 135
[58] Field of Search .................... 438/459, 977, 438/612, 613; 148/DIG. 135

[56] References Cited

U.S. PATENT DOCUMENTS

| | | | |
|---|---|---|---|
| 5,574,285 | 11/1996 | Marion et al. ..................... | 250/370.13 |
| 5,909,634 | 6/1999 | Hotchkiss et al. ..................... | 438/613 |
| 5,953,623 | 9/1999 | Boyko et al. ........................... | 438/612 |
| 5,989,939 | 11/1999 | Fjelstad ................................... | 438/977 |

*Primary Examiner*—Kevin M. Picardat
*Attorney, Agent, or Firm*—Dennison, Scheiner, Schultz & Wakeman

[57] ABSTRACT

A plurality of pad electrodes are formed on a first surface of an IC wafer, and a solder layer is formed on each of the pad electrodes. The first surface of the IC wafer including solder layers is coated with a flux layer, and solder layers are reflowed to round each of the solder layers, thereby forming each solder layer into a solder bump. An adhesive tape is adhered on the flux layer, and a second surface opposite to the first surface of the IC wafer is ground to form a flip chip semiconductor device.

4 Claims, 3 Drawing Sheets

METHOD FOR MANUFACTURING A FLIP CHIP SEMICONDUCTOR DEVICE

BACKGROUND OF THE INVENTION

The present invention relates to a method for manufacturing flip chip semiconductor devices.

In recent years, flip chip bonding has been developed, wherein a bare chip is directly mounted on a substrate by face down mounting in order to miniaturize the semiconductor package and to increase the distribution density of elements. Because of the marketing of the VTR with a camera, the portable telephone, and others, portable devices have successively appeared, on each of which a small package having a size approximately equal to the bare chip is mounted. The small chip is referred to as CSP (chip size package, chip scale package). The development of the CSP has promptly progressed recently, and a demand for the miniaturizing and thinning of the semiconductor device has accordingly become real.

A conventional method for manufacturing the flip chip semiconductor will be described hereinafter.

In general, there are used several methods for forming solder bumps on the pad electrode surface of an IC wafer, which methods are a stud bump method, ball bump method, plate bump method, and others. In the plate bump method, windows are formed on an IC wafer at positions of pad electrodes in the resist, the IC wafer is dipped in molten solder in a bath so that solder bumps are formed by plating. Since the plate bump method may form bumps at a small pitch between pad electrodes, the method is effective in miniaturization of the IC chip.

FIG. 3 shows manufacturing steps of the conventional plate bump method.

A step (a) shows a semiconductor element forming step. A plurality of pad electrodes 2 are formed at predetermined positions on a surface of an IC wafer 1 having a predetermined thickness t1, for example t1=625 μm. At a step (b), a double sided adhesive tape 3 (tape for back grinding) is adhered on the surface 1a where the pad electrodes 2 are formed. A step (c) is a back grinding step, where the outer surface of the tape 3 is fixed to a grinding table of a grinder (not shown), and the side of the wafer 1 opposite to the adhesive tape 3 is ground with a grindstone 4 to a predetermined thickness t2, for example t2=400 μm. At a step (d), the tape 3 for back grinding is peeled off. More particularly, the double sided adhesive tape 3 is irradiated with ultraviolet rays to harden the adhesive surface of the tape 3, thereby removing the adhesive strength from the tape. Thus, the tape 3 is peeled from wafer 1.

At a step (e), windows are formed in a resist provided on the surface 1a at the pad electrodes 2. Thereafter, the IC wafer 1 is dipped in melted solder in a solder bath, so that a solder layer 5 is formed on each pad electrode 2 by plating. At a step (f), flux 6 is coated on the surface 1a to cover the solder layers 5. At a step (g), the solder layers 5 are reflowed at a predetermined temperature, so that each solder layer 5 is formed into a ball shape. Thus, a solder bump 7 is formed on each of the pad electrodes 2. The flux 6 is washed down at a step (h). The product is inspected at an inspection step (i).

In the conventional method, after the grinding of the IC wafer, the solder bumps 7 are formed by heating the solder layers 5. However, since there is formed a plurality of micro-cracks in the IC wafer, the micro-crack is expanded by the heating of the IC wafer, which may cause the wafer to break.

SUMMARY OF THE INVENTION

An object of the present invention is to provide a method which may manufacture the semiconductor element without breaking the IC wafer at a low cost.

According to the present invention, there is provided a method for manufacturing a semiconductor device comprising the steps of forming a plurality of pad electrodes on a first surface of an IC wafer, forming a solder layer on each of the pad electrodes, coating the first surface of the IC wafer including solder layers with a flux layer, reflowing solder layers to round each of the solder layers, thereby forming each solder layer into a solder bump, adhering an adhesive tape on the flux layer, grinding a second surface opposite the first surface of the IC wafer, peeling the adhesive tape from the solder bumps, removing the flux layer from the IC wafer.

The pad electrodes are formed by a plate bump method.

The flux layer is formed by a spin coating method.

The present invention further provides a method for manufacturing a semiconductor device comprising the steps of forming a plurality of pad electrodes on a first surface of an IC wafer, forming a solder layer on each of the pad electrodes, coating the first surface of the IC wafer including solder layers with a flux layer, reflowing solder layers to round each of the solder layers, thereby forming each solder layer into a solder bump, removing the flux layer from the IC wafer, coating the first surface of the IC wafer including solder bumps with a protective layer, adhering an adhesive tape on the protective layer, grinding a second surface opposite to the first surface of the IC wafer, peeling the adhesive tape from the solder bumps, removing the protective layer from the IC wafer.

These and other objects and features of the present invention will become more apparent from the following detailed description with reference to the accompanying drawings.

DETAILED DESCRIPTION OF THE PREFERRED EMBODIMENT

Figure 1:
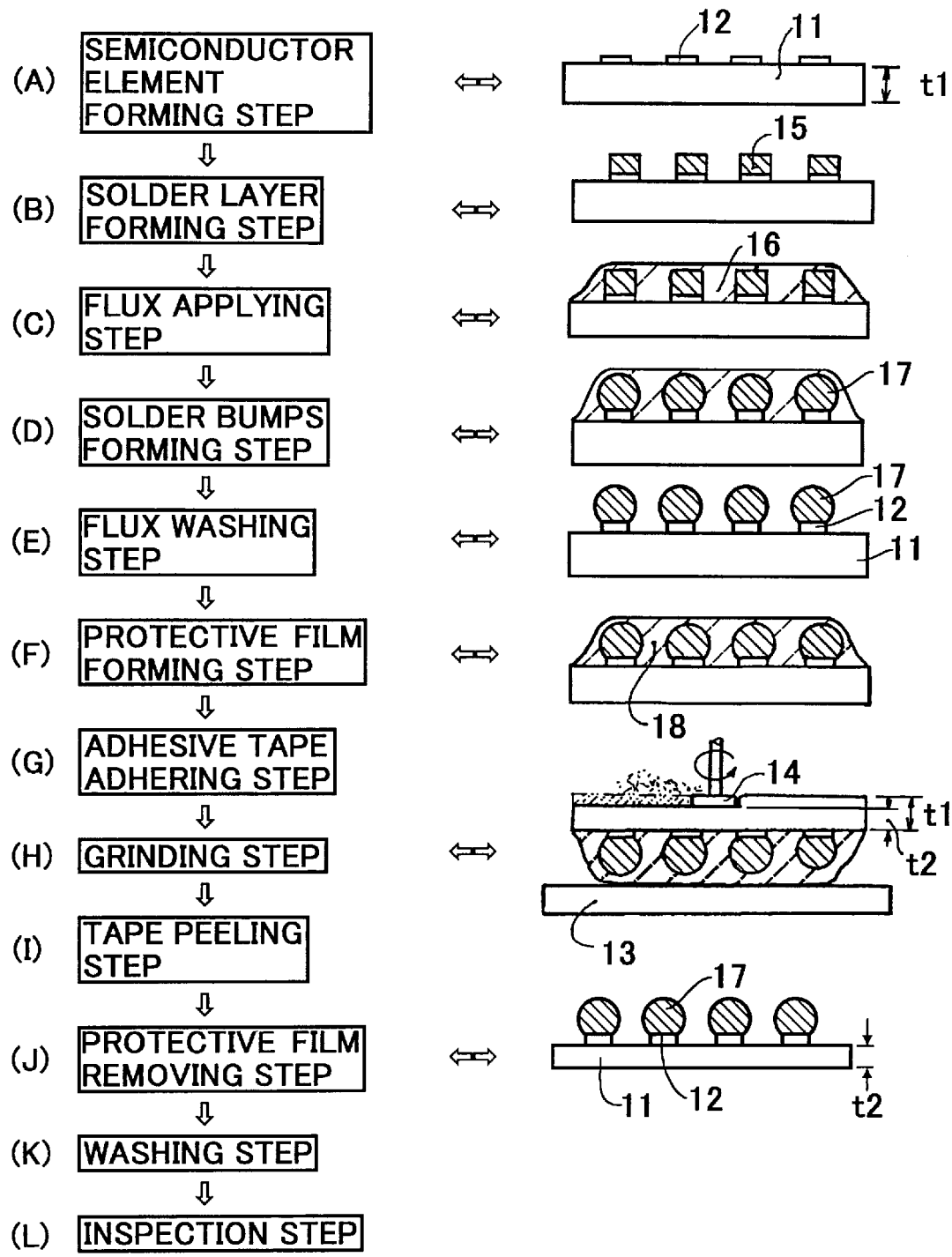
FIG. 1 is a diagram showing manufacturing steps of a first embodiment of the present invention.

Referring to FIG. 1 showing the first embodiment of the present invention, at a semiconductor element forming step (A), a plurality of pad electrodes 12 are formed on an IC wafer 11 together with a printed circuit. The IC wafer 1 has a thickness t1, for example t1=625 μm. A plurality of solder layers 15 are formed on the pad electrodes 12 by the plate bump method at a solder layer forming step (B). At a flux coating step (C), flux consisting of pine resin dissolved with thinner is applied to the IC active surface where the solder layers 15 are formed by spin coating to form a flux layer 16.

At a solder bumps forming step (D), the solder layers 15 are reflowed by heating at a predetermined temperature, so that each solder layer 15 is formed into a ball shape. Thus, a solder bump 17 is formed on each of the pad electrodes 12. The flux 16 is washed down at a step (E).

At a step (F), the solder bumps 17 and the IC wafer 11 are coated with resist by spin coating so that a protective film 18 is formed for protecting the IC active surface. Thereafter, at a step (G), an adhesive tape 13 is adhered on the surface of the protective film 18. A step (H) is a back grinding step, where the outer surface of the tape 13 is fixed to a grinding table of a grinder (not shown), and the side of the wafer 11 opposite to the adhesive tape 13 is ground with a grindstone 14 to a predetermined thickness t2, for example t2=400 µm. At a step (I), the tape 13 for back grinding is peeled off. More particularly, the double sided adhesive tape 13 is irradiated with ultraviolet rays to harden the adhesive surface of the tape 13, thereby removing the adhesive strength from the tape. Thus, the tape 3 is peeled.

At a step (J), the protective film 18 is removed with solvent. Furthermore, at a step (K), the wafer 11 is washed.

The product is finally inspected at an inspection step (L).

Figure 2:
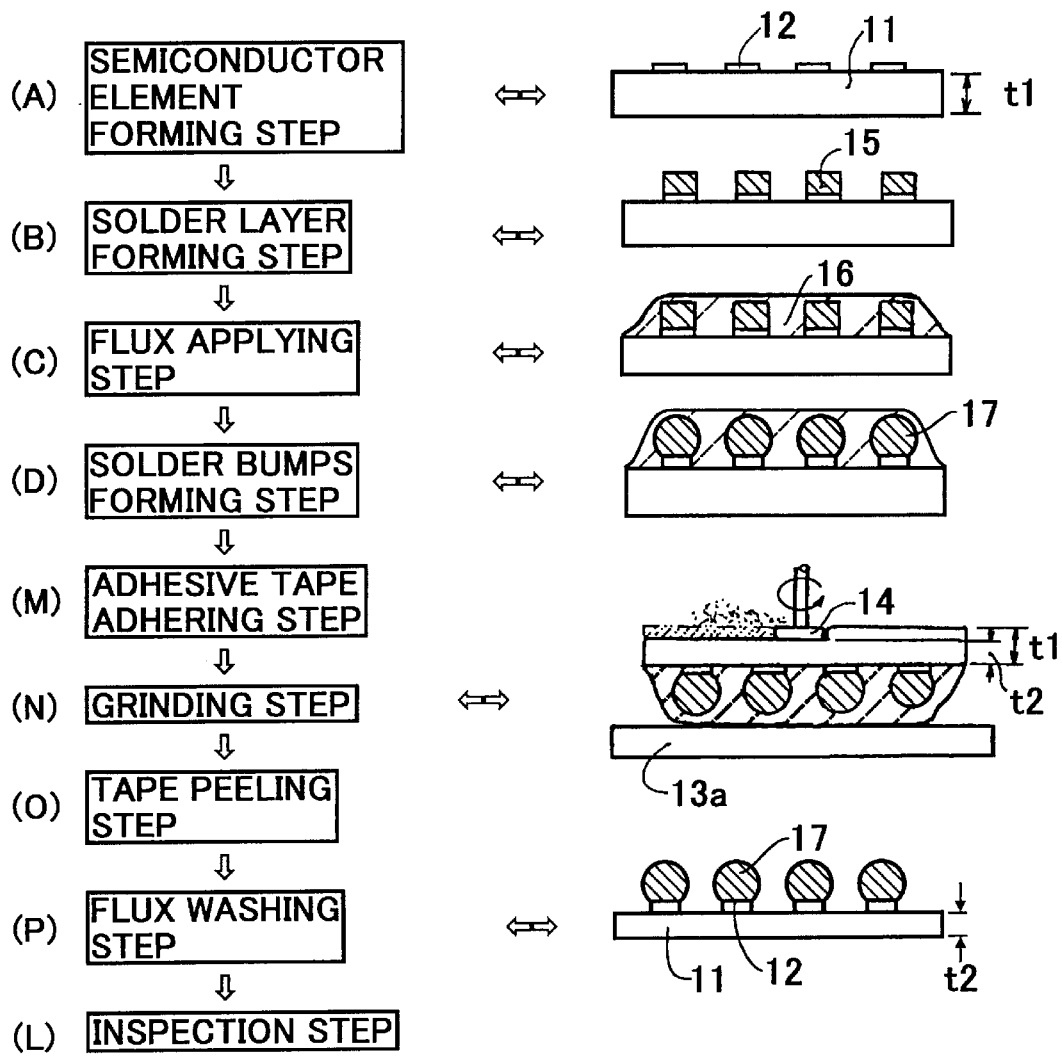
FIG. 2 is a diagram showing manufacturing steps of a second embodiment of the present invention.
Figure 3:
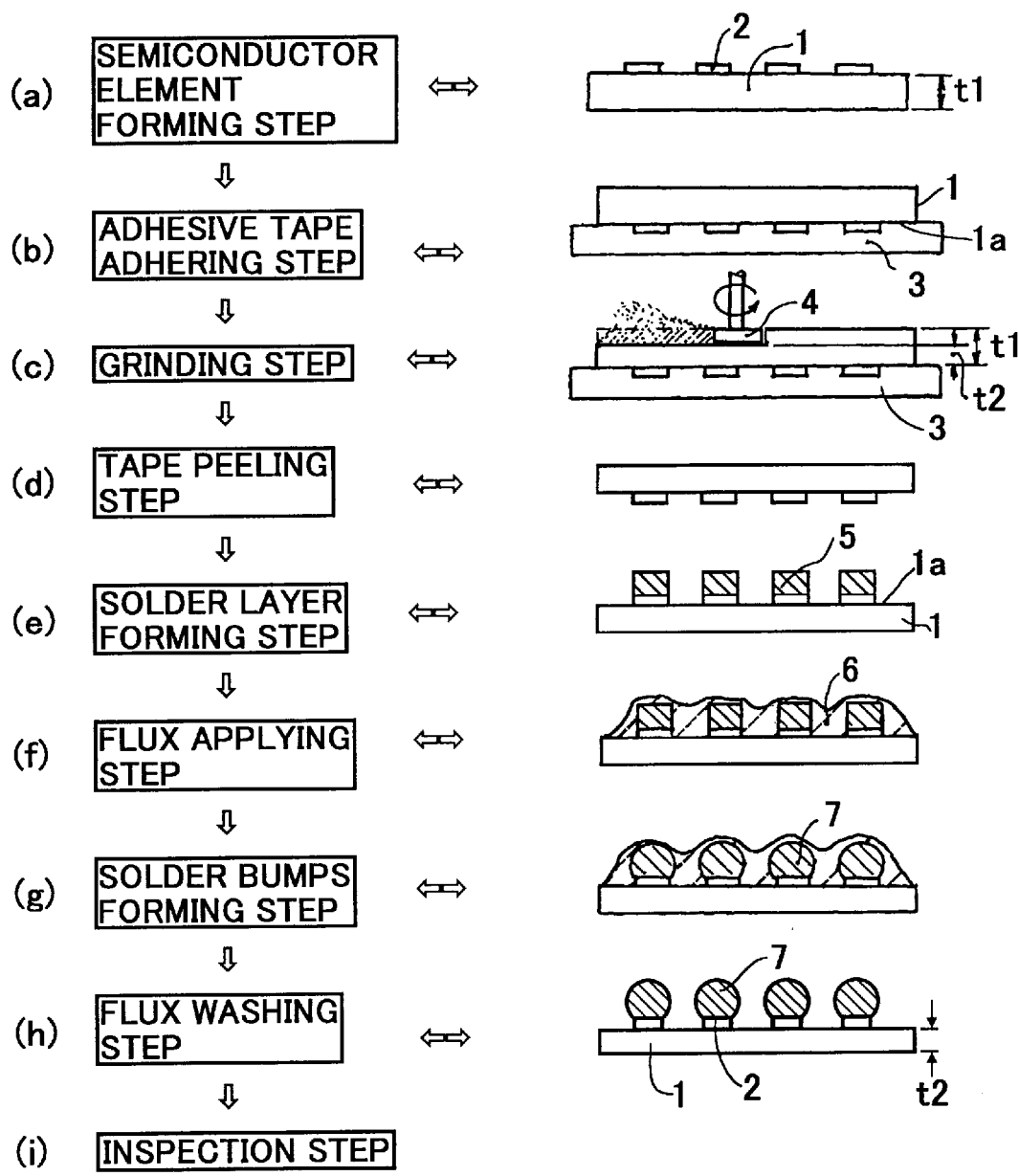
FIG. 3 is a diagram showing manufacturing steps of a conventional method.

Referring to FIG. 2 showing the second embodiment of the present invention steps from semiconductor element forming step (A) to the solder bumps forming step (D) are the same as the steps of FIG. 1.

At a step (M), an adhesive tape 13a for back grinding is adhered on the surface of the flux layer 16. A step (N) is a back grinding step, where the outer surface of the tape 13a is fixed to a grinding table of a grinder (not shown), and the side of the wafer 11 opposite to the adhesive tape 13a is ground with the grindstone 14 to a predetermined thickness t2, for example t2=400 µm. At a step (0), the tape 13a for back grinding is peeled off.

The flux layer 16 is washed down at a step (P) and the semiconductor device is inspected at the step (L).

In accordance with the present invention, solder layers on the IC wafer are reflowed whereby each solder layer is formed into a ball shape. Thereafter, the active surface of the IC wafer is coated with a protective film, and the back side of the IC wafer is ground. Grinding chips does not adhere on the active surface, and the IC wafer does not break consequently. In particular, in the second embodiment, the flux layer is used for the protective film as it is, and hence the manufacturing process is simplified and the productivity is increased, thereby reducing the manufacturing cost.

Furthermore, since the whole of the IC wafer including solder bumps is uniformly hardened by the flux, it is possible to prevent the load from concentrating on solder bumps at the grinding step, thereby preventing the deformation of the solder bumps.

While the invention has been described in conjunction with preferred specific embodiment thereof, it will be understood that this description is intended to illustrate and not limit the scope of the invention, which is defined by the following claims.

What is claimed is:

1. A method for manufacturing a semiconductor device comprising the steps of:

forming a plurality of pad electrodes on a first surface of an IC wafer;

forming a solder layer on each of the pad electrodes;

coating the first surface of the IC wafer including solder layers with a flux layer;

reflowing solder layers to round each of the solder layers, thereby forming each solder layer into a solder bump;

adhering an adhesive tape on the flux layer;

grinding a second surface opposite the first surface of the IC wafer;

peeling the adhesive tape from the solder bumps; and removing the flux layer from the IC wafer.

2. The method according to claim 1 wherein the pad electrodes are formed by a plate bump method.

3. The method according to claim 1 wherein the flux layer is formed by a spin coating method.

4. A method for manufacturing a semiconductor device comprising the steps of:

forming a plurality of pad electrodes on a first surface of an IC wafer;

forming a solder layer on each of the pad electrodes;

coating the first surface of the IC wafer including solder layers with a flux layer;

reflowing solder layers to round each of the solder layers, thereby forming each solder layer into a solder bump;

removing the flux layer from the IC wafer;

coating the first surface of the IC wafer including solder bumps with a protective layer;

adhering an adhesive tape on the protective layer;

grinding a second surface opposite to the first surface of the IC wafer;

peeling the adhesive tape from the solder bumps; and removing the protective layer from the IC wafer.

* * * * *